(12) United States Patent
Kim et al.

(10) Patent No.: US 6,346,738 B1
(45) Date of Patent: Feb. 12, 2002

(54) FUSE OPTION CIRCUIT OF INTEGRATED CIRCUIT AND METHOD THEREOF

(75) Inventors: Hong-Beom Kim; Boo-Jin Kim; Sang-Seok Kang, all of Suwon (KR)

(73) Assignee: Samsung Electronics, Co., Ltd., Suwon (KR)

(*) Notice: Subject to any disclaimer, the term of this patent is extended or adjusted under 35 U.S.C. 154(b) by 0 days.

(21) Appl. No.: 09/605,469

(22) Filed: Jun. 30, 2000

(30) Foreign Application Priority Data

Aug. 27, 1999 (KR) .......................................... 99-35918

(51) Int. Cl.[7] .............................................. H01L 29/00
(52) U.S. Cl. ....................................... 257/529; 257/538
(58) Field of Search ................................ 257/529, 530, 257/538

(56) References Cited

U.S. PATENT DOCUMENTS

| | | | |
|---|---|---|---|
| 4,996,672 A | 2/1991 | Kim | |
| 5,493,148 A | * 2/1996 | Ohata et al. | ................ 257/538 |
| 5,572,050 A | 11/1996 | Cohen | ........................ 209/257 |
| 5,572,061 A | 11/1996 | Chen et al. | ................. 530/257 |
| 5,573,971 A | 11/1996 | Cleeves | ........................ 60/437 |
| 5,576,576 A | 11/1996 | Hawley et al. | ............. 530/257 |
| 6,040,615 A | * 3/2000 | Nagai et al. | ................. 257/529 |
| 6,078,091 A | * 6/2000 | MacPherson et al. | ....... 257/529 |

FOREIGN PATENT DOCUMENTS

JP 5-251664 * 9/1993 ................. 257/529

* cited by examiner

*Primary Examiner*—Ngân V. Ngô
(74) *Attorney, Agent, or Firm*—Marger Johnson & McCollom, P.C.

(57) ABSTRACT

The present invention relates to a fuse option circuit of an integrated circuit and a method thereof. More particularly it concerns a fuse option circuit comprising: a first fuse formed on a chip, which is cut by providing a larger electric current than a set value; a second fuse formed on the chip identically with the first fuse; a fuse cutting means providing a cutting current loop to the first fuse in response to a fuse cutting signal; and an option signal generating means which produces a fuse option signal by comparing resistance values of the first and second fuses. Accordingly, even if the first use is abnormally cut, the fuse option can be precisely provided by comparing the first fuse having a changed resistance after cutting process with the second fuse keeping an initial resistance value. Therefore, the reliability of a fuse option of an integrated circuit can be improved.

13 Claims, 10 Drawing Sheets

FUSE OPTION CIRCUIT OF INTEGRATED CIRCUIT AND METHOD THEREOF

FIELD OF THE INVENTION

The present invention relates to a fuse option circuit of an integrated circuit and a method thereof. More particularly, it concerns a fuse option circuit for detecting precisely if a fuse is cut or not through comparing resistance values of a cut fuse and a fuse kept without a cutting process which are formed on a chip of an integrated circuit, in order to generate more reliable fuse option signaling.

DESCRIPTION OF THE PRIOR ART

IC products of a semiconductor use an option operating method in order to change an operational mode of a device, product or system. This conventional method is divided into a bonding option, a metal option or a fuse option Particularly, a fuse option is widely used as a repairing method for replacing an abnormal memory cell, generated during manufacturing process of a semiconductor device, with a normal memory cell. A fuse option is divided to a laser cutting method and electrical cutting method. A laser-cutting method is to radiate a laser beam to cut a fuse, as shown in FIG. 1A. An electrical cutting method is to charge an excessive electric current in order to cut a fuse, as shown in FIG. 1B.

An electrical cutting method doesn't have to use a special cutting device for conventing a mode and repairing a memory cell, and its algorithm is very simple. Also, this method can convert a mode and repair a memory cell at the same time of test, and has an advantage that it can be also used at a package level. But the electrical cutting method is not as precise as the laser cutting method. Accordingly, there is much probability of failure in the case of the electrical cutting method and there is a disadvantage that a fuse may be linked again after cutting. Thus, the electrical cut fuse option circuit has been unreliable as compared with the laser fuse option circuit.

FIG. 2 illustrates the conventional fuse option circuit using an electrical cutting method. The fuse option circuit includes a cutting circuit 10, a fuse 12 and an output circuit of a fuse option signal 14. When an enable signal(VCCH) is applied thereto, the fuse option circuit charges or flows the file 12 with a cutting current for a predetermined time so as to cat electrically the fuse 12. Accordingly, an electric potential of a node N is changed from high level to low level by the fuse cutting in the output circuit of the fuse option signal 14, and then this low state is latched to output a fuse option signal OUT of a high state.

In the conventional fuse option circuit, a non-zero fuse resistance produces an output error in case that a fuse is not cut normally, i.e. one that is cut imprecisely as shown in FIG. 1b. And even if an error is not made, an electric current flows through a fuse that is incompletely cut as shown in FIG. 1b. Accordingly, there is the added disadvantage in prior art fuse option circuits of consuming an excessive electric power.

SUMMARY OF THE INVENTION

One aspect of the present invention is to provide a reliable fuse option circuit of an integrated circuit and a method thereof through generating a precise fuse option signal by comparing resistance values of a fuse after cutting and a reference fuse in order to overcome disadvantages of the conventional technology.

Another aspect of the present invention is to provide a fuse option circuit and method thereof for reducing power consumption generated by a fuse that is incompletely cut.

According to the present invention, a circuit comprises: a first fuse, which is formed on a chip and cut when a larger electric current is charged thereto than a set value; a second fuse formed on the chip identically with the first fuse; a fuse cutting means which provides the first fuse with a current loop in response to a fuse cutting signal; and a fuse option signal generating means which produces a fuse option signal, comparing resistance values of the first fuse and the second fuse. It is preferred that the option signal generating means is one chosen from among a CMOS inverter, a latch circuit composed of a CMOS inverter, a differential amplifier, a latch amplifier or a sense amplifier.

A fuse option method according to the present invention comprises the following steps of: arranging a first and second fuses on a chip; cutting the first fuse through charging a cutting current thereto; comparing resistance values of the first and the second fuses; and generating a fuse option signal in response to a result of comparing the resistance values.

BRIEF DESCRIPTION OF THE ATTACHED DRAWINGS

Further objects and advantages of the invention can be more fully understood from the following embodiments taken in conjunction with the accompanying drawings.

DESCRIPTION OF THE PREFERRED EMBODIMENTS

Figure 1A:
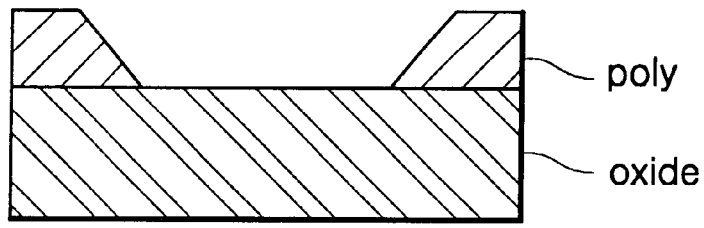
FIG. 1 illustrates a state of cutting in the conventional electrical fuse.
Figure 1B:
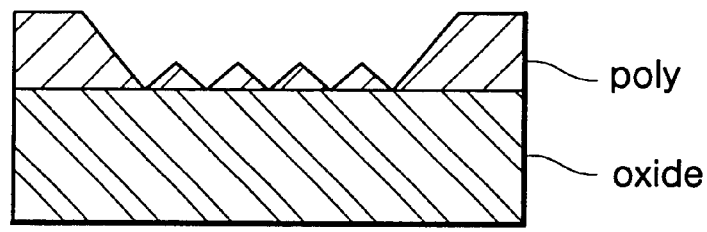
Figure 2:
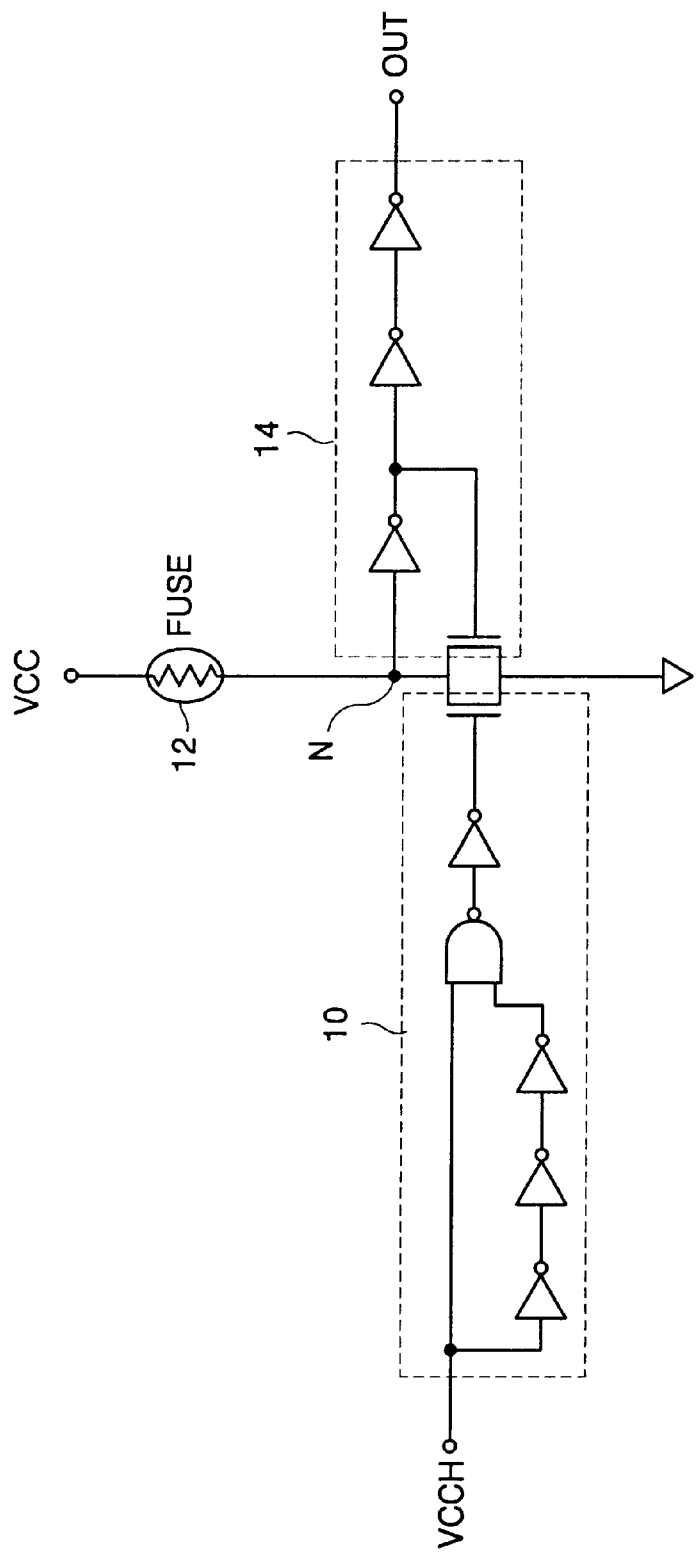
FIG. 2 is a circuit diagram of the conventional fuse option circuit.
Figure 3:
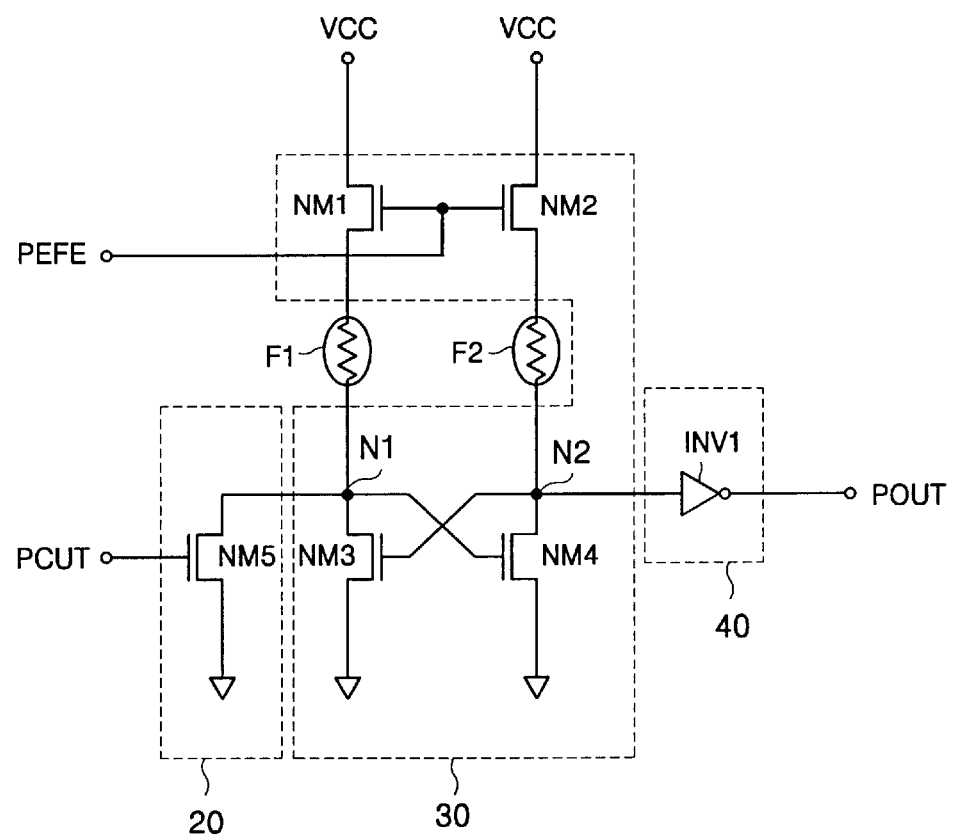
FIG. 3 is a circuit diagram of a fuse option circuit according to a first embodiment of the present invention.

FIG. 3 is a circuit diagram of a fuse option circuit according to tie first embodiment of the present invention.

According to the first embodiment, a fuse option circuit comprises a first fuse F1, a second fuse F2, a fuse cutting means 20, an option signal generating means 30 and an output means 40.

The first and second fuses F1, F2 are made of a polysilicon which is used for forming a bit line, a storage, a gate or a plate, or metal.

The first fuse F1 is electrically cut by the fuse cutting means 20. The second fuse F2 is a reference fuse that maintains an initial resistance value before and after the cutting of fuse F1. The fuse cutting means 20 comprises MOS transistor NM5, that is a fifth switching means, whose drain is connected to one end of the first fuse and whose source is grounded. A fuse cutting signal (PCUT) is applied to its gate.

The option signal generating means 30 comprises a first through fourth switching means, i.e. MOS transistors (NM1–NM4).

A first switching means is the MOS transistor NM1 whose source and drain are connected respectively to the other end of the first fuse F1 and a power supply voltage (VCC), while an enable signal (PEFE) is applied to its gate.

A second switching means is the MOS transistor NM2 whose source and drain are connected respectively to the other end of the second fuse F2 and the power supply voltage (VCC), while an enable signal (PEFE) is applied to its gate.

A third switching means is the MOS transistor NM3 whose source and drain are connected respectively to one end of the first fuse F1 and a ground voltage, while its gate is connected to a second node N2.

A fourth switching means is the MOS transistor NM4 whose source and drain are connected respectively to one end of the second use F2 and a ground voltage, while its gate is connected to a first node N1. The output means 40 is an inverter INV1 for generating a fuse option signal (POUT) by inverting a signal of the second node N2. The current-driving ability of the MOS transistor NM5 is much greater than those of the MOS transistors NM3 and NM4, ad great enough to supply the first fuse F1 with a sufficient cutting current.

Accordingly, in a high level wherein the enable signal (PEFE) is in an active state, the option signal generating means 30 is enabled. When the fuse cutting signal (PCUT) is in a high level and the option signal generating means 30 is enabled, the MOS transistor NM5 is turned on to flow a cutting current through the first fuse F1. Consequently, the first fuse F1 is cut.

When the first fuse F1 is cut and the enable signal (PEFE) is in a high level of an active state, the second node N2 is in a high state via application of a power supply voltage through the second fuse (F2), which turns on MOS transistor NM3. In response to the high level gate input from node N2, NM3 turns on and the first node N1 goes low toward a ground voltage. Accordingly, the first node N1 is latched as a low state, and the second node N2 is latched as a high state. Therefore, a low signal is outputted as the fuse option signal (POUT) through the inverter INV1.

Even if the first fuse F1 is not precisely cut, a resistance value of the first fuse F1 is increased to some appreciable extent by the cutting process, as compared with a resistance value of the second fuse F2, which is identically formed but has not been cut at all. So, much more current is provided to the second node N2 through the second fuse F2 maintaining its initial higher resistance value so that the second node N2 goes to a high voltage state more rapidly than the first node N1. Accordingly, the MOS transistor NM3 is turned on prior to the MOS transistor NM4, and then the second node N2 is latched as a high level.

That is, according to the first embodiment of the present invention, the fuse option signal (POUT) is precisely generated by the difference of the resistance values of two fuses (F1, F2).

Figure 4:
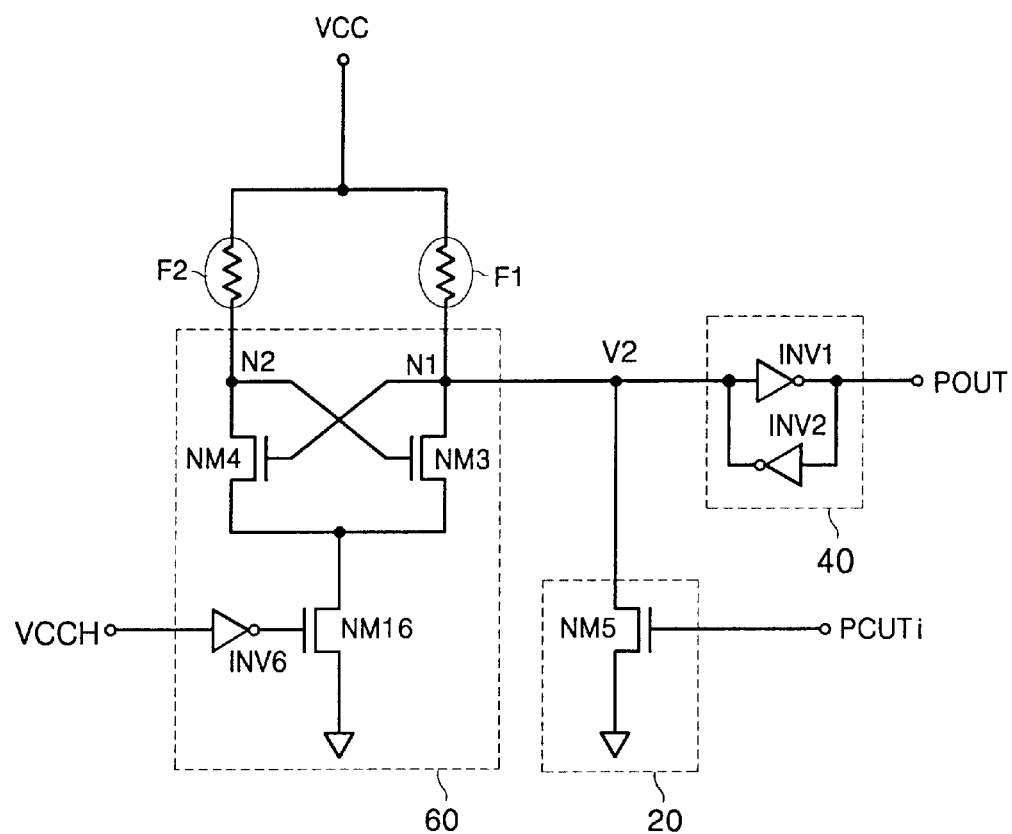
FIG. 4 is a circuit diagram of a fuse option circuit according to a second embodiment of the present invention.

FIG. 4 is a circuit diagram of a fuse option circuit according to the second embodiment of the present invention. A circuit of the second embodiment comprises a first fuse F1, a second fuse F2, a fuse cutting means 20, an option signal generating means 60 and an output means 40. Accordingly, all of the components are identical with the first embodiment except the option signal generating means 60 and the output means 40.

In the second embodiment, the option signal generating means 60 includes three MOS transistors (NM3, NM4, NM16) and an inverter (INV6). The MOS transistors NM3 and NM4 are connected to each other in the same latch configuration as in the first embodiment, and the MOS transistor NM16 is connected between a common source and a ground of two transistors (NM3, NM4). An enable signal (VCCH) is applied to a gate of the MOS transistor NM16 through the inverter INV6. One end of each of the first and second fuses (F1, F2) are commonly connected to power supply voltage (VCC). The output means 40 includes two inverters (INV1, INV2) connected in a latch configuration.

Accordingly, the first fuse F1 is cut by providing the first fuse F1 with a cutting current in response to a high signal of the fuse cuting signal (PCUT).

In case that the first fuse F1 is cut, the option signal generating means 60 is enabled in a low state of the enable signal (VCCH). And a low state of the first node N1 is latched at the output means 40 to output the fuse option signal (POUT) as a high state.

Figure 5:
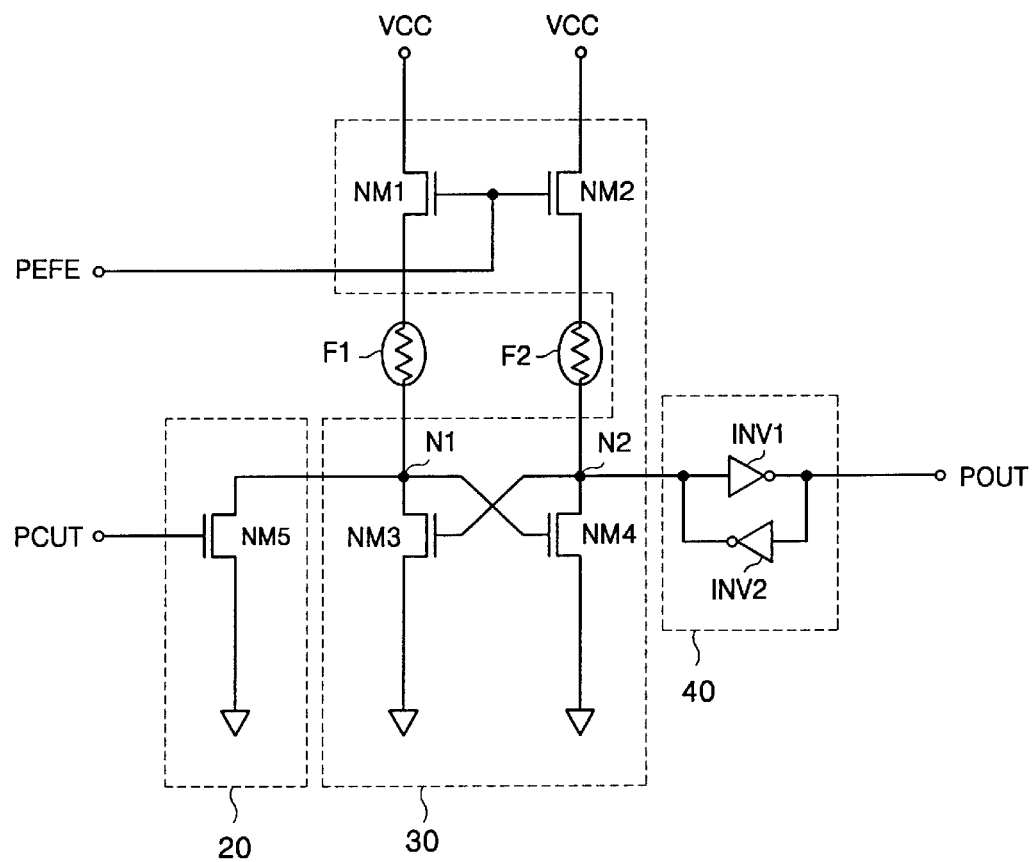
FIG. 5 is a circuit diagram of a fuse option circuit according to a third embodiment of the present invention.

FIG. 5 is a circuit diagram of a fuse option circuit according to the third embodiment of the present invention. All components are identical with the first embodiment except an output means 40 composed of a latch. Other same components appear with the same references without detailed description.

The output means 40 of the third embodiment further comprises an inverter INV2 whose input end is connected to an output end of an inverter INV1, and whose output end is connected to an input end of the inverter INV1.

Figure 6:
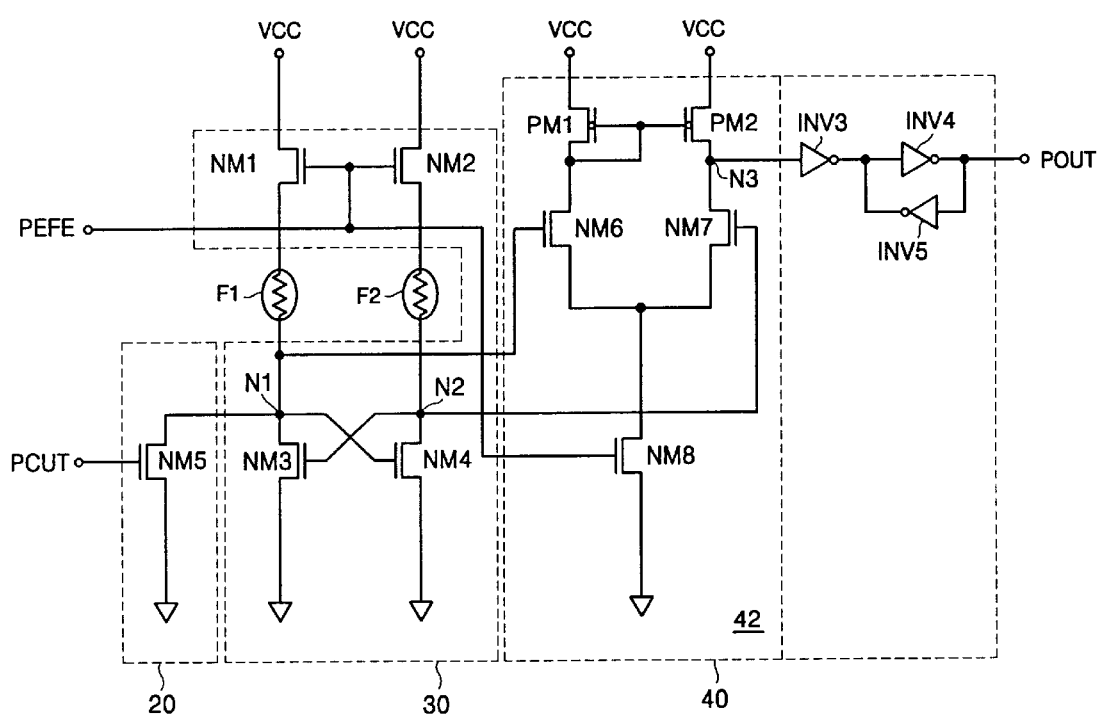
FIG. 6 is a circuit diagram of a fuse option circuit according to a fourth embodiment of the present invention.

FIG. 6 is a circuit diagram of a fuse option circuit according to the fourth embodiment of the present invention. All components are identical with the first embodiment except an output means 40 composed of a differential amplifier 42. Other same components appear with the same references without detailed description.

The differential amplifier 42 comprises two PMOS transistors (PM1, PM2) and three NMOS transistors (NM6, NM7, NM8), A gate of the MOS transistor NM6 is connected with a first node N1, and a gate of the MOS transistor NM7 is connected with a second node N2. And a gate of the MOS transistor NM8 is connected with an enable signal (PEFE). Accordingly, in the differential amplifier 42, an inverted output terminal N3 is maintained in a low state by an electric potential difference between the first node N1 and the second node N2. Therefore, a fuse option signal (POUT) is outputted as a low signal through the inverter INV3 and the latch (INV4, INV5).

Figure 7:
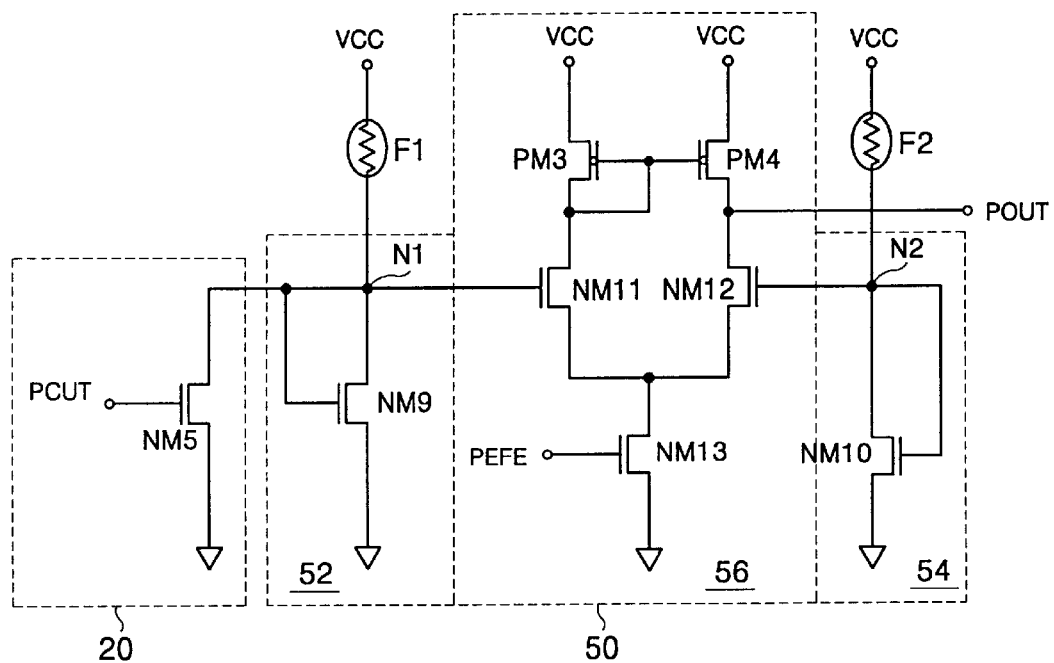
FIG. 7 is a circuit diagram of a fuse option circuit according to a fifth embodiment of the present invention.
Figure 8:
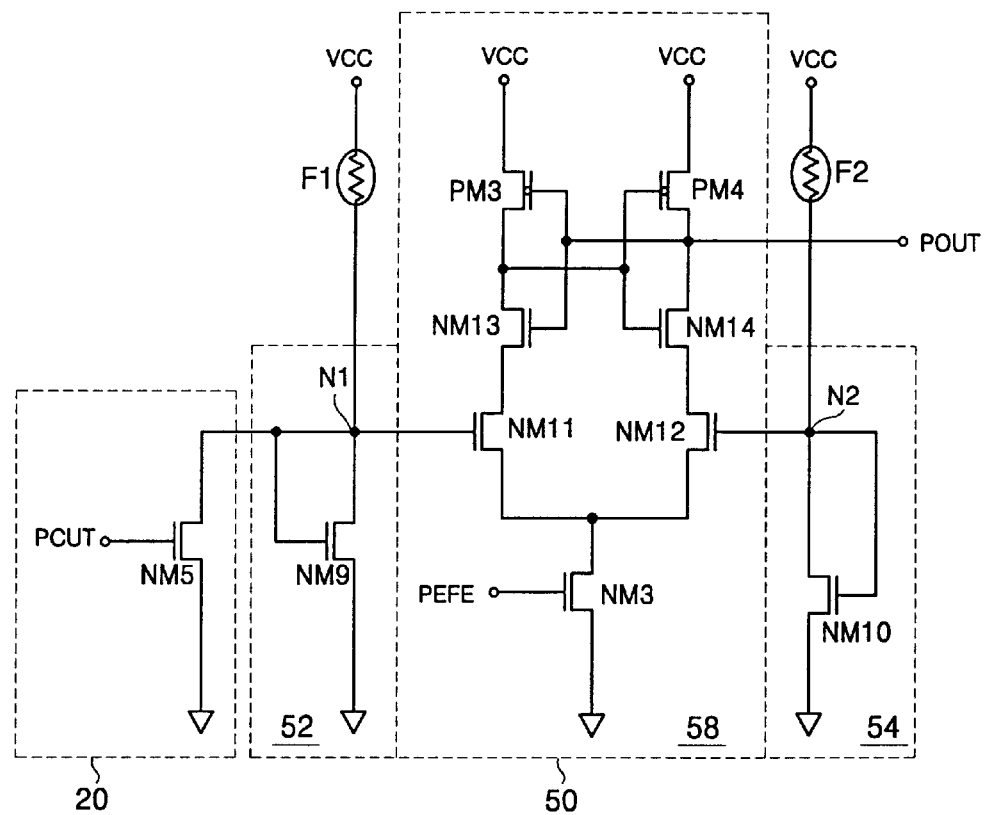
FIG. 8 is a circuit diagram of a fuse option circuit according to a sixth embodiment of the present invention.

FIG. 7 and FIG. 8 are circuit diagrams of a fuse option circuit according to the fifth and sixth embodiment of the present invention respectively. In the fifth and sixth embodiments, an option signal generating means 50 is an amplifier.

A circuit of the fifth embodiment comprises a first fuse F1, a second fuse F2, a fuse cutting means 20 and an option signal generating means 50. The option signal generating means 50 comprises a first input means 52, a second input means 54 and a differential amplifier 56. The first input means 52 is a MOS transistor NM9 whose gate and drain are connected to a first node N1 and whose source is grounded.

The second input means 54 is a MOS transistor NM10 whose gate and drain are connected to a second node N2 and whose source is grounded. The differential amplifier 56 includes two PMOS transistors (PM3, PM4) and three NMOS transistors (NM11–NM13). A gate of the MOS transistor NM11 is connected with the first node N1, a gate of the MOS transistor NM12 is connected with the second node N2. A gate of the MOS transistor NM13 is connected with an enable signal (PEFE).

Accordingly, the differential amplifier outputs a fuse option signal (POUT) of a low state on an inverted output terminal by amplifying an electric potential difference between the first and second node.

All components of the sixth embodiment shown in FIG. 8 are identical with the first embodiment except the differential amplifier 58 is a latch amplifier. Other same components appear with the same references without detailed description.

The latch amplifier 58 includes two PMOS transistors (PM3, PM4) and five NMOS transistors (NM3, NM11–NM14). The MOS transistors (PM3, NM13) and the MOS transistors (PM4, NM14) are connected respectively as a CMOS transistor construction, and two inverters are connected to each other in a latch configuration. Accordingly, a latched output is provided based upon a differential input from fuses F1, F2.

Figure 9:
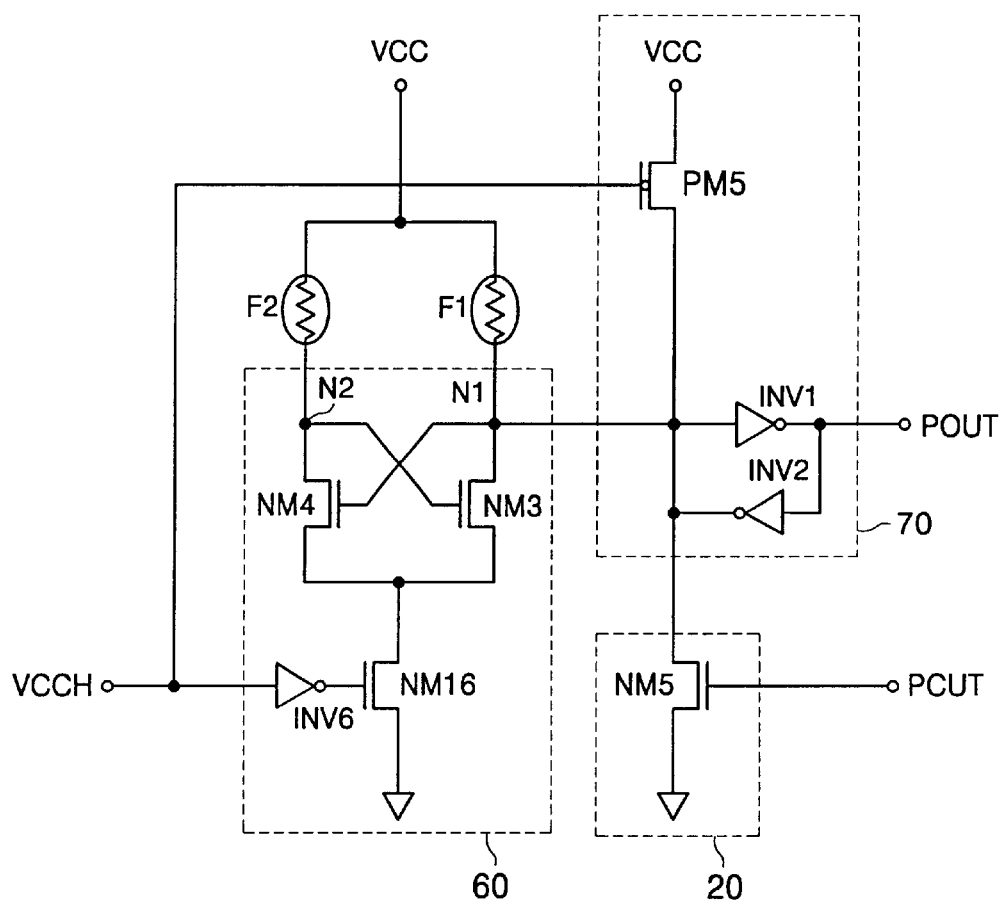
FIG. 9 is a circuit diagram of a fuse option circuit according to a seventh embodiment of the present invention.
Figure 10:
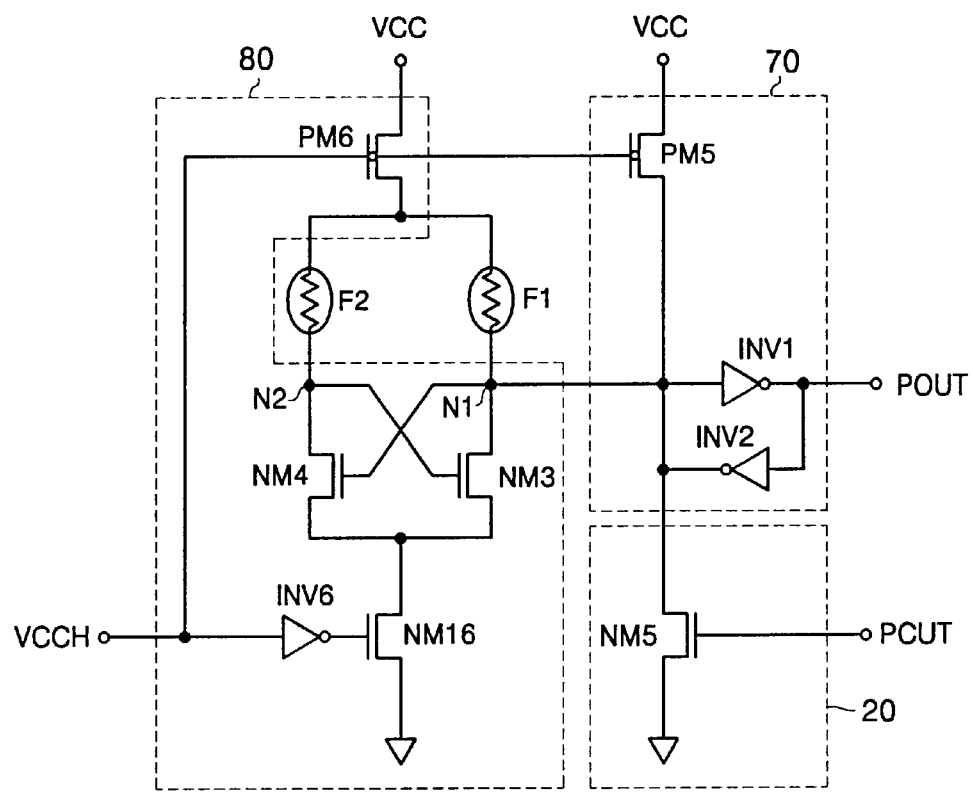
FIG. 10 is a circuit diagram of a fuse option circuit according to a eighth embodiment of the present invention.

FIG. 9 is a circuit diagram of a fuse option circuit according to the seventh embodiment of the present invention. FIG. 10 is a circuit diagram of a fuse option circuit according to the eighth embodiment of the present invention.

A circuit of the seventh embodiment comprises a first fuse F1, a second fuse F2, a fuse cutting means 20, an option signal generating means 60 and an output means 70. The option signal generating means 60 includes three MOS transistors (NM3, NM4, NM16) and an inverter (INV6). The MOS transistors (NM3, NM4) are connected to each other in the same latch construction as described in the first embodiment. And the MOS transistor (NM16) is connected between a common source of two transistors (NM3, NM4) and a ground. An enable signal (VCCH) is applied to a gate of the MOS transistor (NM16) through the inverter (INV6).

The output means 70 includes two inverters (INV1, INV2) connected to each other in a latch configuration, and a PMOS transistor (PM5). An input terminal of the latch construction is connected to a first node N1, and an enable signal (VCCH) is applied to a gate of the MOS transistor (PM5) whose drain is connected to the first node N1.

Accordingly, the first fuse F1 is cut by providing a cutting current thereto in response to a high signal of a fuse cutting signal (PCUT).

In case that the first fuse F1 is cut, the option signal generating means 60 and the output means 70 are enabled in a low state of the enable signal (VCCH). And the low state is latched to the first node N1 to output the fuse option signal (POUT) as a high state.

All components of the eighth embodiment shown in FIG. 10 are identical with the seventh embodiment shown in FIG. 9 except for an option signal generating means 80 having a PMOS transistor (PM6) to be turned on by an enable signal (VCCH). Other same components appear with the same references without detailed description.

A source and drain of the MOS transistor (PM6) are connected between a power supply voltage (VCC) and a point of contact of a first fuse F1 and a second fuse F2, an enable signal (VCCH) is applied to a gate of the MOS transistor (PM6).

The circuits of the seventh and eighth embodiments operate only when they are enabled by the enable signal (VCCH), so that there is no electrical current consumption in a standby state As described above, an integrated circuit provides a pair of a fuse to be cut and a reference fuse on a chip, compares resistance values of the cut fuse and the reference fuse, and then generates a fuse option signal as result of the comparison. Accordingly, even if the fuse is not precisely cut or the fuse is linked again, power consumption can be reduced since any current that flows through the fuse is slight.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A fuse option circuit of an integrated circuit, comprising:

a first fuse which is formed on a chip, and which is cut by providing a larger electric current than a set value;

a second fuse which is formed on said chip as same with said first fuse;

a fuse cutting means providing a cutting current loop to said first fuse in response to a fuse cutting signal; and an option signal generating means which produces a fuse option signal by comparing resistance values of said first fuse and second fuse.

2. The fuse option circuit as claimed in claim 1, wherein said first and second fuse are made of a polysilicon or metal.

3. The fuse option circuit as claimed in claim 2, wherein said polysilicon is one used for forming a bit line, storage, a gate or a plate.

4. The fuse option circuit as claimed in claim 1, wherein said option signal generating means comprises:

a first switching means for connecting a power supply voltage to one end of said first fuse in response to an enable signal;

a second switching means for connecting said power supply voltage to one end of said second fuse in response to said enable signal;

a third switching means for connecting a ground voltage to the other end of said first fuse in response to a second node voltage applied to the other end of said second fuse; and a fourth switching means for connecting the ground voltage to the other end of said second fuse in response to a first node voltage applied to the other end of said first fuse.

5. The fuse option circuit as claimed in claim 4, wherein said fuse cutting meat is connected between the other end of said first fuse and a ground, comprising a fifth switching means which is switched in response to said fuse cutting signal.

6. The fuse option circuit as claimed in claim 4, further comprising an output means which is connected to the other end of said second fuse so as to output the second node voltage of said option signal generating means as a fuse option signal.

7. The fuse option circuit as claimed in claim 6, said output means being one chosen from among a CMOS inverter, a latch circuit composed of two CMOS inverters, a differential amplifier, a latch amplifier and a sense amplifier.

8. The fuse option circuit as claimed in claim 1, wherein said option signal generating means comprises:

a first switching means which is connected between the other end of said first fuse and a common connection point, and which is switched in response to a second node voltage applied to the other end of said second fuse, wherein one end each of said first and second fuses is connected to a common power supply voltage;

a second switching means which is connected between the other end of said second fuse and a common point of contact, said second switching means being switched in response to a second node voltage applied to the other end of said first fuse; and a third switching means for connecting a ground voltage to a common connection point of said first and second switching means.

9. The fuse option circuit as claimed in claim 8, wherein said fuse cutting means comprises a fourth switching means which is connected between the other end of said first fuse and a ground potential, said fourth switching means being switched in response to said fuse cutting signal.

10. The fuse option circuit as claimed in claim 8, further comprising an output means which is connected to the other end of said first fuse to output a first node voltage of said option signal generating means as a fuse option signal.

11. The fuse option circuit as claimed in claim 10, said output means being one chosen from among a CMOS inverter, a latch circuit composed of two CMOS inverters, a differential amplifier, a latch amplifier and a sense amplifier.

12. The fuse option circuit as claimed in claim 7, said fuse option signal generating circuit being a differential amplifier or a latch amplifier.

13. A fuse option method of an integrated circuit, comprising:

providing first and second fuses on a chip;

cutting said first fuse by providing a cutting current thereto;

comparing resistance values of said first and second fuses; and generating an indication whether said first fuse is open as a result of said comparison.

* * * * *

UNITED STATES PATENT AND TRADEMARK OFFICE
CERTIFICATE OF CORRECTION

PATENT NO.    : 6,346,738 B1
DATED         : February 12, 2002
INVENTOR(S)   : Kim et al.

It is certified that error appears in the above-identified patent and that said Letters Patent is hereby corrected as shown below:

Column 1,
Line 18, "option" should read -- option. --.
Line 29, "conventing" should read -- converting --.
Line 45, "file 12" should read -- fuse 12 --.
Line 46, "cat" should read -- cut --.

Column 3,
Line 30, "ad" should read -- and --.

Column 4,
Line 46, "NM8)," should read -- NM8). --.

Column 6,
Line 6, "standby state" should read -- standby state. --.
Line 37, "second fuse" should read -- second fuses --.
Line 59, "meat" should read -- means --.

Signed and Sealed this

Twenty-first Day of January, 2003

JAMES E. ROGAN
*Director of the United States Patent and Trademark Office*